United States Patent
Miyaguchi et al.

(10) Patent No.: US 6,921,309 B2
(45) Date of Patent: Jul. 26, 2005

(54) METHOD FOR MANUFACTURING A LIGHT EMISSION DISPLAY PANEL

(75) Inventors: Satoshi Miyaguchi, Saitama-ken (JP); Isamu Ohshita, Yamagata-ken (JP)

(73) Assignees: Pioneer Electronic Corporation, Tokyo (JP); Tohoku Pioneer Electronic Corporation, Yamagata (JP)

( * ) Notice: Subject to any disclaimer, the term of this patent is extended or adjusted under 35 U.S.C. 154(b) by 72 days.

(21) Appl. No.: 10/417,178

(22) Filed: Apr. 17, 2003

(65) Prior Publication Data

US 2003/0201715 A1 Oct. 30, 2003

Related U.S. Application Data

(62) Division of application No. 09/071,919, filed on May 5, 1998, now abandoned.

(30) Foreign Application Priority Data

May 9, 1997 (JP) ............................................. 9-136009

(51) Int. Cl.[7] .............................. H01J 9/00; B05D 5/12
(52) U.S. Cl. .............................. 445/24; 445/46; 427/66
(58) Field of Search .................................. 313/500–512; 445/24, 46, 49; 427/66, 68, 69; 428/690, 917; 15/169.3, 169.1

(56) References Cited

U.S. PATENT DOCUMENTS

| | | | |
|---|---|---|---|
| 4,511,599 A | 4/1985 | Rustomji | 427/66 |
| 5,693,428 A | 12/1997 | Fujii et al. | 313/504 X |
| 5,701,055 A | 12/1997 | Nagayama et al. | 313/506 X |
| 5,736,754 A | 4/1998 | Shi et al. | 313/504 X |
| 5,804,836 A | 9/1998 | Heeger et al. | 313/500 X |
| 5,821,690 A | 10/1998 | Martens et al. | 313/506 |
| 6,054,725 A | 4/2000 | Liedenbaum et al. | 313/507 X |
| 6,592,933 B2 * | 7/2003 | Himeshima et al. | 427/66 |
| 6,627,332 B2 * | 9/2003 | Utsugi et al. | 428/690 |
| 6,811,809 B2 * | 11/2004 | Utsugi et al. | 427/66 |

* cited by examiner

Primary Examiner—Karabi Guharay
(74) Attorney, Agent, or Firm—Arent Fox PLLC

(57) ABSTRACT

A light emission display panel has a substrate, a plurality of first electrodes on the substrate, a light emission layer on the first electrodes, and a plurality of second electrodes. Each of the second electrodes has a form of a strip film in which partially overlapped portions are provided.

3 Claims, 7 Drawing Sheets

METHOD FOR MANUFACTURING A LIGHT EMISSION DISPLAY PANEL

This is a division of U.S. patent application Ser. No. 09/071919, now abandoned, filed on May 5, 1998.

BACKGROUND OF THE INVENTION

The present invention relates to a light emission display panel.

As a self emission type light emission display panel, an organic electroluminescence (hereinafter called organic EL) is noticed because of high efficiency, long life and high fineness.

FIGS. 6a and 6b show a conventional organic EL display panel. The organic EL display panel comprises a transparent glass substrate 1, and a first electrode 2 comprising a plurality of transparent strips of anodes 2 formed on the glass substrate 1 into parallel lines. The first electrode 2 is made of ITO by patterning processes (for example a pitch of 0.3 mm, width of 0.28 mm, thickness of 0.2 mm). On the first electrode 2, a light emission layer 7 comprising an organic hole transporting layer 3, light emission organic layer 4, and organic electron transporting layer 5 is coated by the evaporation method. Furthermore, a second electrode 6 comprising a plurality of strips as metallic cathodes is formed on the light emission layer 7 into parallel lines so as to intersect the first electrode 2. The second electrode 6 is formed on the layer 7 by a method such as evaporation, CVD, PVD, or spattering, using a metal mask of FIG. 7. The display panel is sealed for the prevention of humidity.

The intersection of each first electrode 2 and second electrode 6 is a pixel which emits light by applying a voltage to the electrodes.

Referring to FIG. 7, the metal mask for the evaporation has a plurality of openings 8 and partitions 9 between the openings 8. The openings. 8 are formed by the number of the second electrodes and has a shape equal to the shape of the second electrode.

The width of the opening 8 is several hundreds microns, and the width W of the partition 9 is several tens microns.

Because of such an extremely small dimension, the metal mask has a small mechanical strength, and hence it is liable to be broken of bent. Furthermore, there is a problem that adjacent electrodes contacts with each other in the production of the display panel. In order to solve such problems, it is thinkable to increase the thickness of the metal mask. However, there is a limit to produce a high fineness film. Hence, the thickness of about 0.1 mm is a limit. On the other hand, if the width W is increased, the interval between pixels increases, which means the retrogression against the tendency to fineness of the pixel.

SUMMARY OF THE INVENTION

An object of the present invention is to provide a display panel having a high reliability and corresponding to the tendency to the increase of fineness of the display panel.

According to the present invention, there is provided a light emission display panel having a substrate, a plurality of first electrodes on the substrate, a light emission layer on the first electrodes, and a plurality of second electrodes, wherein each of the second electrodes has a form of a strip film in which partially overlapped portions are provided.

The present invention further provides a method for manufacturing a light emission display panel having a substrate, a plurality of first electrodes on the substrate, a light emission layer on the first electrodes, and a plurality of second electrodes.

The method comprises wherein the steps of providing a mask in which a plurality of openings are formed along a line corresponding to each of the second electrodes, interposing a predetermined space between adjacent openings, each of the openings having a width equal to the width of the second electrodes, mounting the mask on the light emission layer so that each of the openings corresponds to the first electrode, forming a film in each opening by a material for the second electrode, shifting the mask by a pitch corresponding to said space, and forming a film in each opening of the shifted mask, whereby the second electrodes are formed.

Adjacent lines are offset by at least a distance equal to a length of the opening in an extending direction of the second electrode.

The space is smaller than a length of the opening in the extending direction of the second electrode so as to overlap both ends of the film with an adjacent film.

A distance between adjacent openings is a multiple of integer of the space.

In an aspect of the present invention, the method comprises the steps of providing a mask in which a plurality of openings each of which has an entire length of the second electrode are parallely formed, interposing a space having a width corresponding to a width of at least one electrode, mounting the mask on the light emission layer so that each of the openings corresponds to the first electrode, forming a film in each opening by a material for the second electrode, shifting the mask by a pitch corresponding to said space, and forming a film in each opening of the shifted mask, whereby the second electrodes are formed.

These and other objects and features of the present invention will become more apparent from the following detailed description with reference to the accompanying drawings.

DETAILED DESCRIPTION OF THE PREFERRED EMBODIMENT

Figure 1:
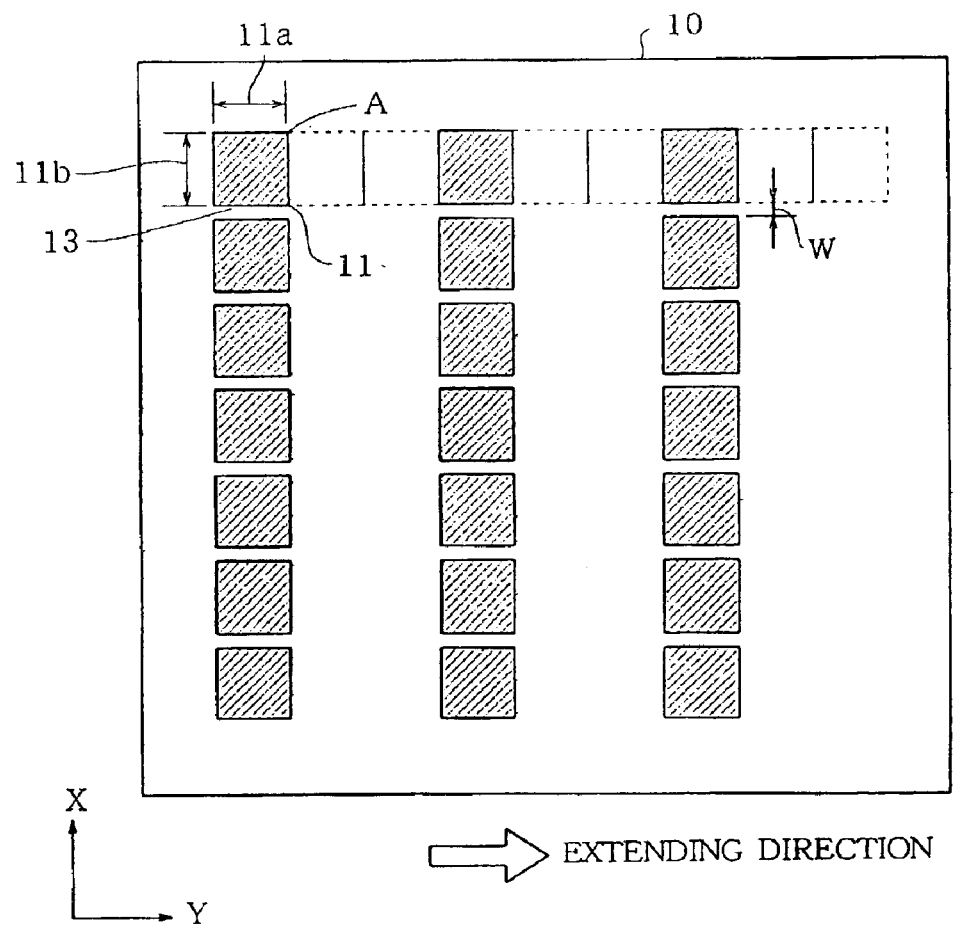
FIG. 1a is a plan view of a mask according to a first embodiment of the present invention.
FIG. 1b is an enlarged view of a part of the mask.
Figure 1:
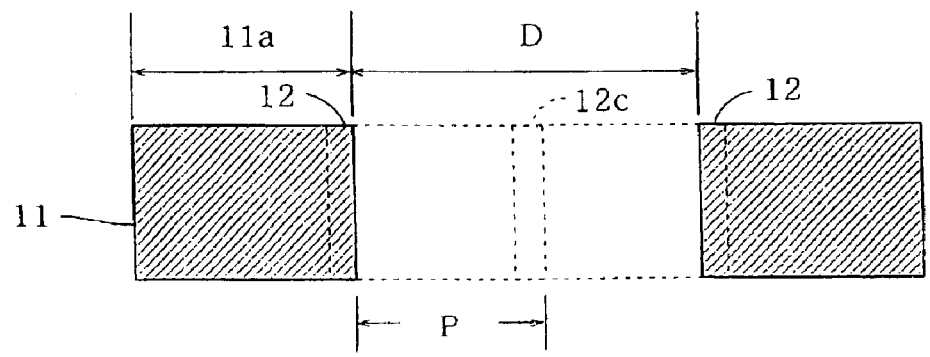

Referring to FIG. 1a, a mask 10 for manufacturing the second electrodes has a plurality of openings 11 (hatched portion) having a long side 11a and a short side 11b. The length of the short side 11b is equal to the width of the second electrode. On the side of the long side 11a, a plurality of openings are formed interposing a partition 13 between adjacent openings, arranged in the longitudinal direction (X direction) which is the arrangement direction of the second electrodes, thereby forming a first opening line. Similarly, a second opening line and third opening line are formed in the lateral direction (Y direction), interposing a distance which is smaller than the double of the long side 11a. Although three opening lines is shown in FIG. 1a, actually a plurality of lines necessary for the length (about 10 cm) of the second electrodes are provided.

Figure 2:
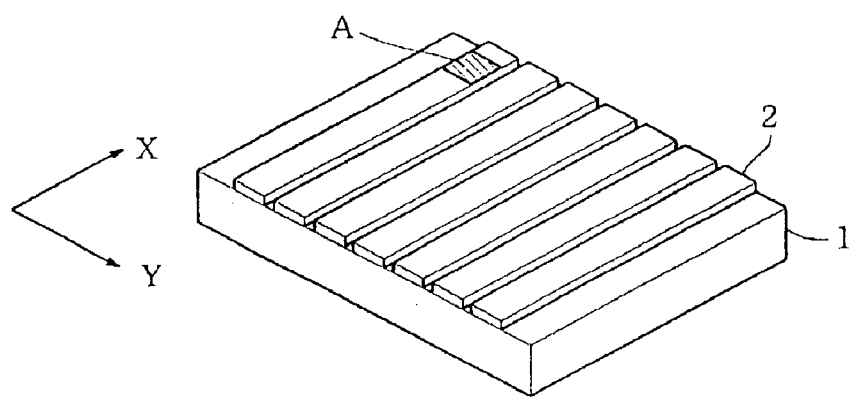
FIGS. 2a to 2c show processes for manufacturing the mask.
Figure 2:
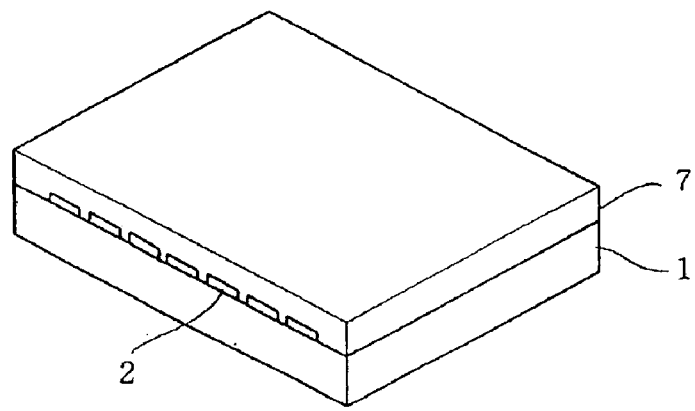
Figure 2:
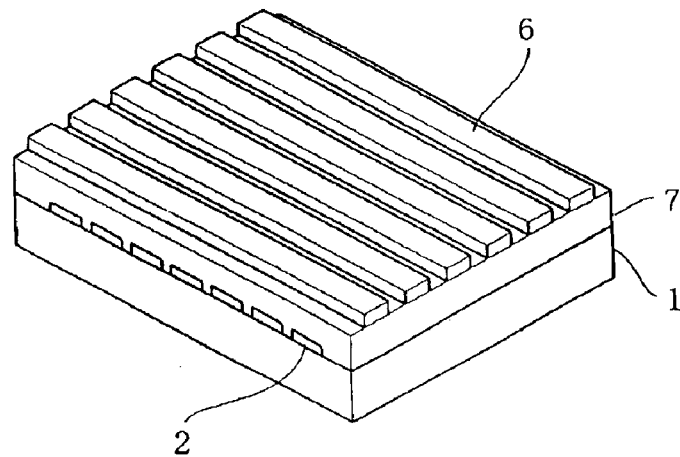

The process for manufacturing the display panel will be described hereinafter with reference to FIGS. 2a to 2c.

As the first step, a plurality of first electrodes 2 (transparent electrodes) each of which is made of ITO strip are formed on the transparent glass substrate 1 arranged in parallel by sputtering method or lithography.

At a second step, the light emission layer 7 of an organic EL medium comprising the organic hole transporting layer 3, organic light emission layer 4 and organic electron transporting layer 5 is uniformly formed on the first electrode 2 by evaporation method as shown in FIG. 2b, thereby forming a first substrate.

At a third step, the mask 10 of FIG. 1 is mounted on the light emission layer 7 so that the left side edge coincides with the lift side edge of the light emission layer 7. More specifically, the mask 10 is located so that the opening 11 of the left side upper most opening designated by A coincides with the position designated by A in FIG. 2a. Then films for the second electrode are formed at every opening 11 by spraying a material for the electrode by evaporation, CVD, PVD or sputtering method. Thus, a film having the same shape as the opening 11 is formed on the light emission layer 7.

Next, the mask 10 is shifted by one pitch P to the right (extending direction of the second electrode) as shown in FIG. 1b. At the shifted position, the material is sprayed to form a film, and then the mask is further shifted to the next right position by the pitch P, and a film is formed. Thus, a strip of each second electrode is formed. The distance D between the openings is smaller than the double of length of the long side of the opening 11, and the length of the shifted pitch P is longer than the half of the distance D and shorter than the length of the long side of the opening 11. Therefore, the film formed by the opening is overlapped with adjacent films at both sides 12 thereof as shown in FIG. 1b.

The overlapped portion of the film becomes thick, so that the strength of the second electrode is enhanced.

Although the distance D is about double of the long side of the opening, the distance is not limited to the double.

Figure 7:
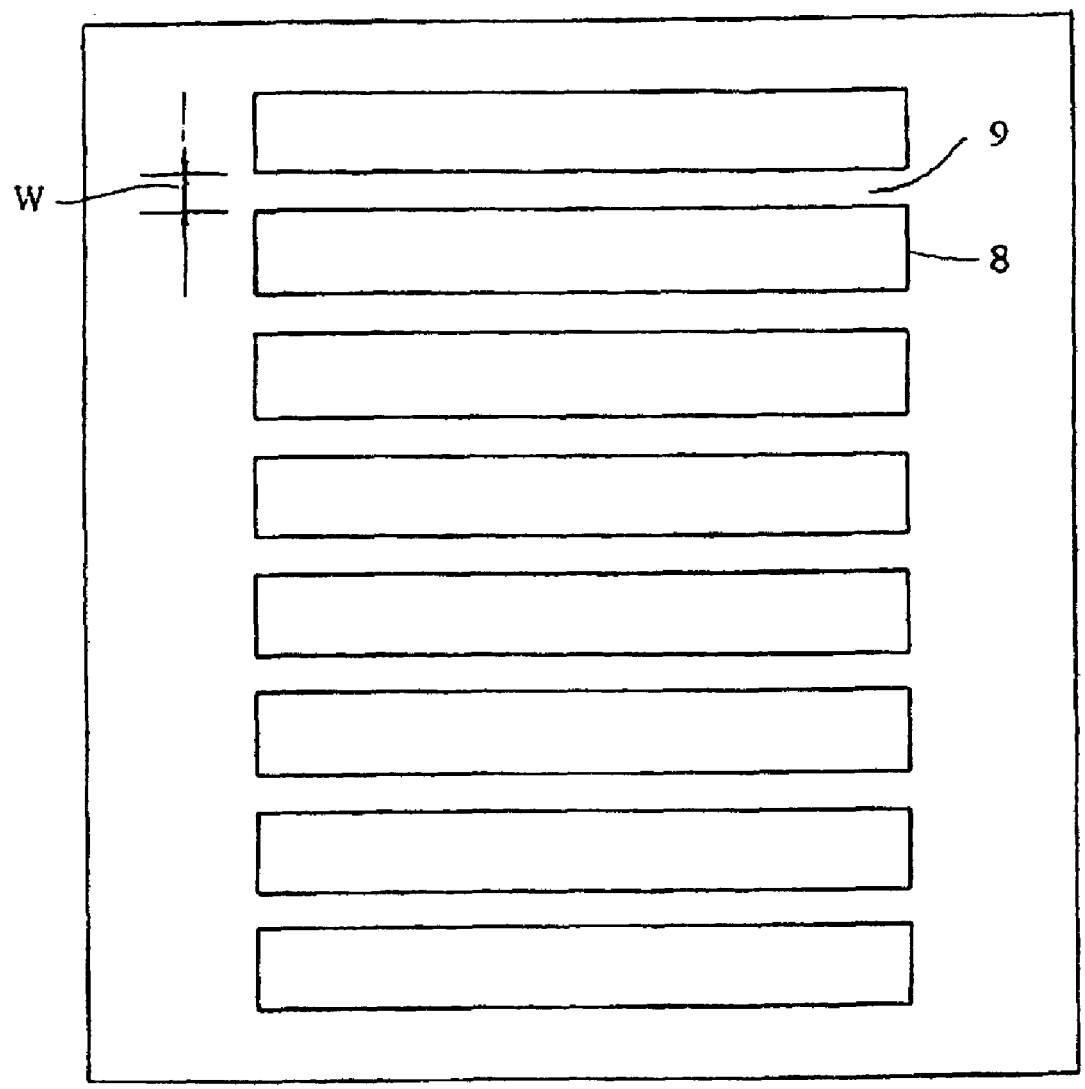
FIG. 7 is a plan view showing a conventional metal mask.

The length of the partition at each opening is very short compared with the partition 9 of FIG. 7, so that the partition is hardly broken. Therefore, the opening does not communicate with adjacent opening. It should be noted that if the adjacent openings communicate, the adjacent second electrodes is short-circuited.

Figure 3:
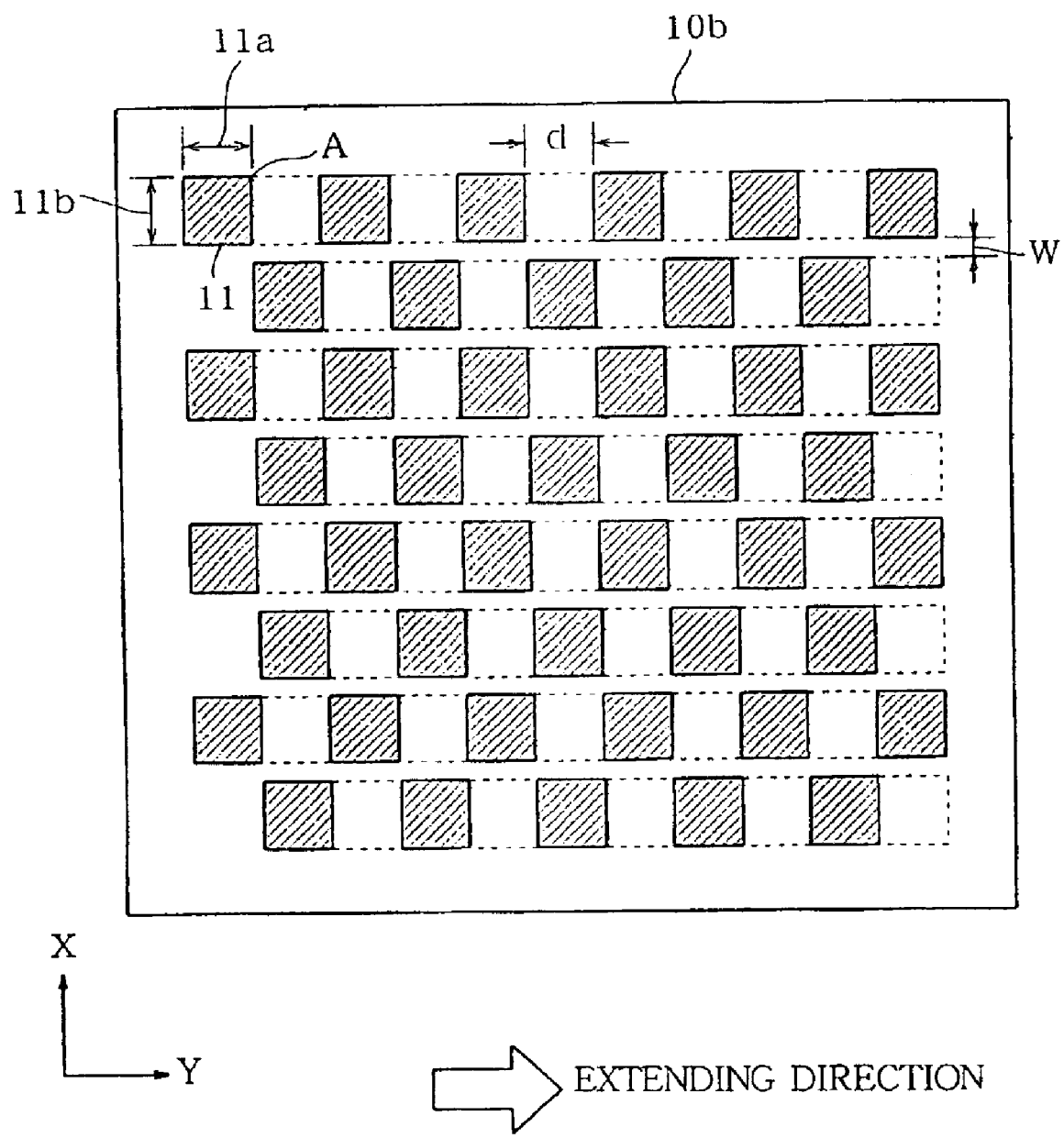
FIG. 3 is a plan view of a mask of a second embodiment.

FIG. 3 shows the mask of the second embodiment of the present invention.

Each line for the second electrode has an arrangement of openings interposing a space having a distance d smaller than the long side 11a of the opening 11. The adjacent lines are offset by the length of the long side of the opening.

The first and second steps for manufacturing the display panel is the same as the first embodiment.

At the third step, the mask 10b is mounted on the light emission layer 7 in the same manner as the first embodiment. Namely, the opening A of FIG. 3 is located at the A of FIG. 2. A film is formed at each opening by spraying the material. Then, the mask 10b is shifted to the right so that both ends of the opening overlaps with the formed film, and a film is formed on the space between films.

In the second embodiment, the length of the partition between the adjacent lines is very short, thereby increasing the strength of the mask.

Figure 4:
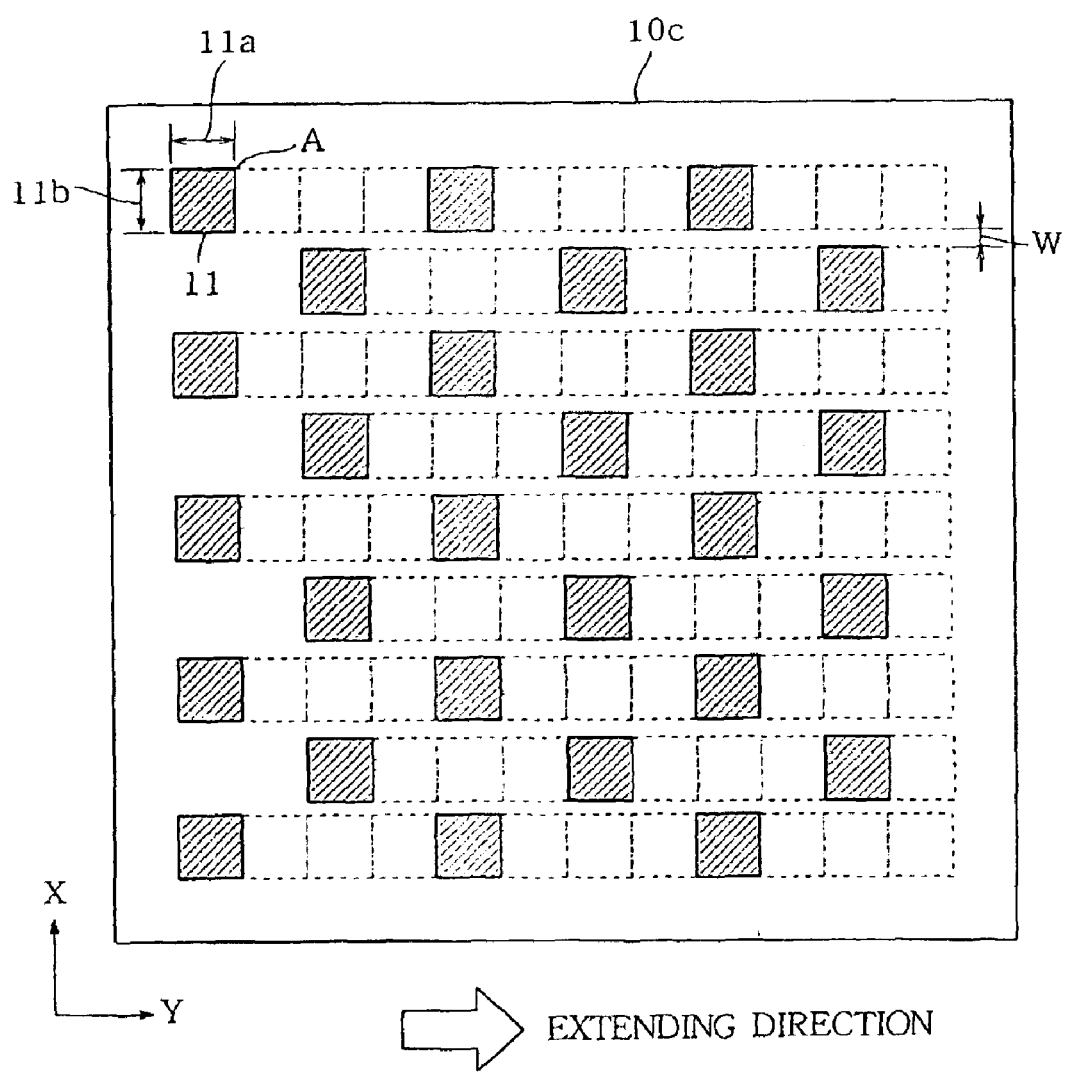
FIG. 4 is a plan view of a display panel of a third embodiment.

In the third embodiment of FIG. 4, the openings on one line of a mask 10c are disposed interposing a space having a length of about three long side of the opening. The adjacent lines are offset by about double of the long side of the opening. The mask 10c is shifted three times for forming film in the space.

Figure 5:
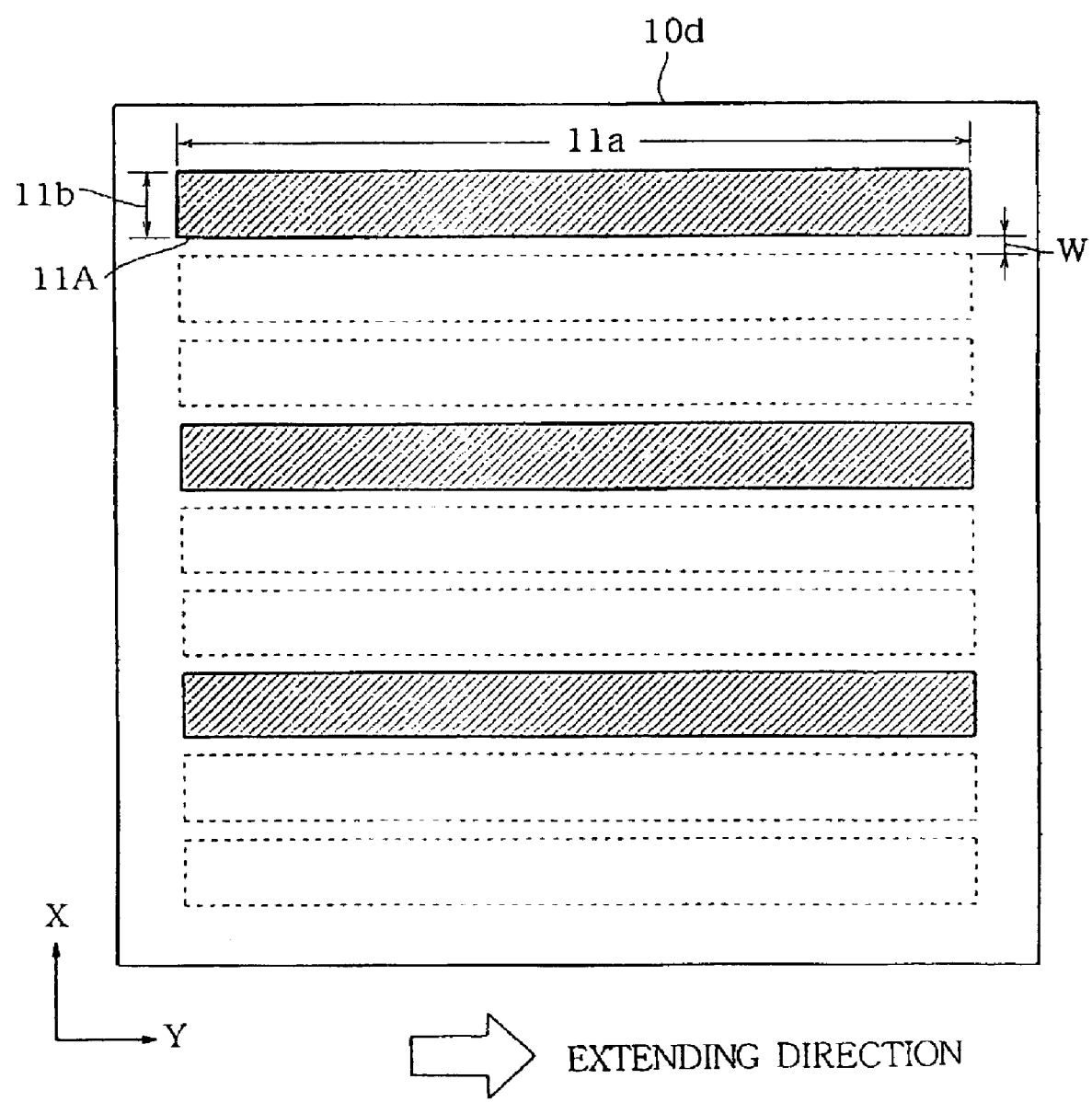
FIG. 5 is a plan view of a mask of a fourth embodiment.
Figure 6:
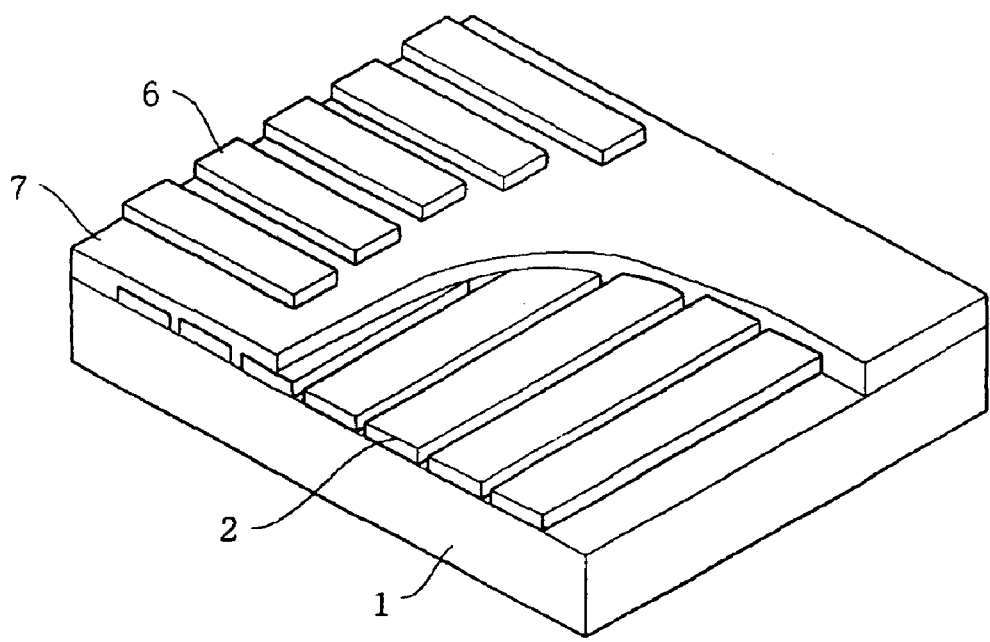
FIG. 6a is a perspective view of a part of a conventional display panel.
FIG. 6b is a side view of the display panel.
Figure 6:
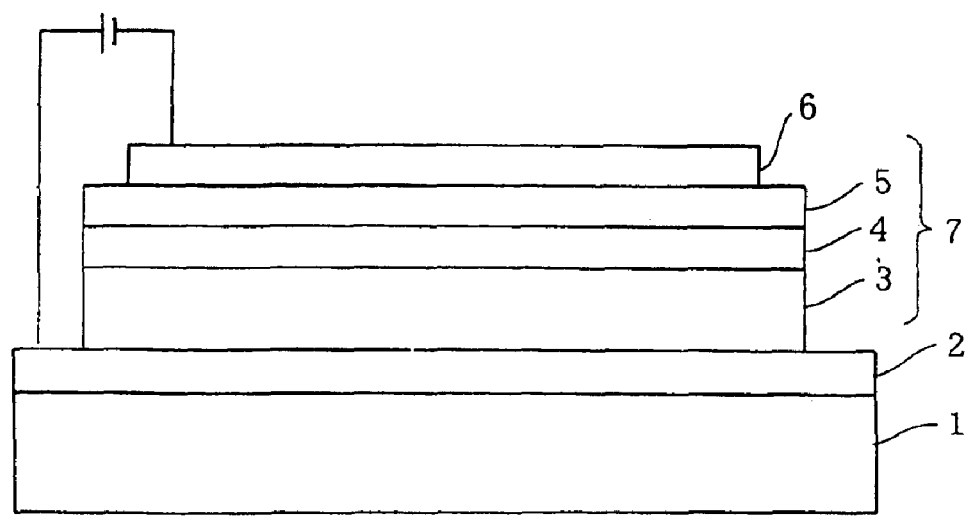

A mask 10d of the fourth embodiment shown in FIG. 5 has an opening 11A having an entire length of the second electrode. The openings are provided at every three lines. The mask is shifted in the direction X by a distance of a length of the short side plus the width N so that second electrodes are formed.

In accordance with the present invention, there is provided overlapped portions in each second electrode, thereby increasing the strength of the electrode. Thus, a display panel having high reliability and fineness of pixels can be obtained.

While the invention has been described in conjunction with preferred specific embodiment thereof, it will be understood that this description is intended to illustrate and not limit the scope of the invention, which is defined by the following claims.

What is claimed is:

1. A method for manufacturing a light emission display panel having a substrate, a plurality of first electrodes on the substrate, a light emission layer on the first electrodes, and a plurality of second electrodes, comprising the steps of:

providing a mask in which a plurality of openings are formed along lines corresponding to the second electrodes, interposing a predetermined space between every two adjacent openings along the lines, each of the openings having a width equal to the width of the second electrodes;

mounting the mask on the light emission layer so that each of the openings corresponds to at least one of the first electrodes;

forming a film in each opening by a material for the second electrode;

shifting the mask by a pitch smaller than said space or shorter than a length of each opening; and forming a film in each opening of the shifted mask, whereby the second electrodes are formed, wherein adjacent openings are spaced apart from each other by at least a distance equal to a length of the opening in an extending direction of the second electrode.

2. The method according to claim 1 wherein a distance between adjacent openings is an integer multiple of length of the opening in the extended direction of the second electrode.

3. A method for manufacturing a light emission display panel having a substrate, a plurality of first electrodes on the substrate, a light emission layer on the first electrodes, and a plurality of second electrodes, comprising the steps of:

providing a mask in which a plurality of openings, each having an entire length of the second electrode, are parallely formed, interposing a space between every two adjacent openings, each space having a width corresponding to at least twice the width of said second electrode;

mounting the mask on the light emission layer so that each of the openings corresponds to each of the first electrodes in a mutually orthogonal relation;

forming a film in each opening by a material for the second electrode;

shifting the mask in a direction perpendicular to the length of the second electrodes by a pitch smaller than said space; and forming a film in each opening of the shifted mask, whereby the second electrodes are formed.

* * * * *